United States Patent
Daubenspeck et al.

(10) Patent No.: US 8,778,792 B2
(45) Date of Patent: Jul. 15, 2014

(54) SOLDER BUMP CONNECTIONS

(71) Applicant: International Business Machines Corporation, Armonk, NY (US)

(72) Inventors: Timothy H. Daubenspeck, Colchester, VT (US); Jeffrey P. Gambino, Westford, VT (US); Ekta Misra, Fishkill, NY (US); Christopher D. Muzzy, Burlington, VT (US); Wolfgang Sauter, Hinesburg, VT (US); George J. Scott, Chandler, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/758,386

(22) Filed: Feb. 4, 2013

(65) Prior Publication Data

US 2013/0140695 A1 Jun. 6, 2013

Related U.S. Application Data

(62) Division of application No. 12/963,139, filed on Dec. 8, 2010, now Pat. No. 8,492,892.

(51) Int. Cl.
*H01L 21/44* (2006.01)

(52) U.S. Cl.
USPC ........................................................ 438/614

(58) Field of Classification Search
USPC ........................................................ 438/614
See application file for complete search history.

(56) References Cited

U.S. PATENT DOCUMENTS

| 3,461,357 | A | | 8/1969 | Mutter et al. |
| 4,113,578 | A | | 9/1978 | Del Monte |
| 5,171,711 | A | | 12/1992 | Tobimatsu |
| 5,291,019 | A | | 3/1994 | Powell et al. |
| 5,462,638 | A | * | 10/1995 | Datta et al. ................... 438/695 |
| 5,471,092 | A | | 11/1995 | Chan et al. |

(Continued)

FOREIGN PATENT DOCUMENTS

| JP | 2002016065 A | 1/2002 |
| WO | 2007064073 A1 | 6/2007 |

OTHER PUBLICATIONS

X. Liu, "Processing and reliability assessment of solder joint interconnection for power chips," Ph.D. dissertation, Virginia Polytech. Inst. State Univ., Blacksburg, VA, 2001. Chaper 2 pp. 39-82.*

(Continued)

*Primary Examiner* — Yu-Hsi D Sun
*Assistant Examiner* — Grant Withers
(74) *Attorney, Agent, or Firm* — Wood, Herron & Evans, LLP; David Cain

(57) ABSTRACT

Solder bump connections and methods for fabricating solder bump connections. The method includes forming a layer stack containing first and second conductive layers, forming a dielectric passivation layer on a top surface of the second conductive layer, and forming a via opening extending through the dielectric passivation layer to the top surface of the second conductive layer. The method further includes forming a conductive plug in the via opening. The solder bump connection includes first and second conductive layers comprised of different conductors, a dielectric passivation layer on a top surface of the second conductive layer, a via opening extending through the dielectric passivation layer to the top surface of the second conductive layer, and a conductive plug in the via opening.

20 Claims, 3 Drawing Sheets

(56) References Cited

U.S. PATENT DOCUMENTS

| | | | |
|---|---|---|---|
| 5,656,858 A | 8/1997 | Kondo et al. | |
| 5,736,456 A | 4/1998 | Akram | |
| 5,753,973 A | 5/1998 | Yasunaga et al. | |
| 5,937,320 A | 8/1999 | Andricacos et al. | |
| 6,133,136 A | 10/2000 | Edelstein et al. | |
| 6,162,652 A | 12/2000 | Dass et al. | |
| 6,165,885 A | 12/2000 | Gaynes et al. | |
| 6,197,613 B1* | 3/2001 | Kung et al. | 438/106 |
| 6,222,279 B1 | 4/2001 | Mis et al. | |
| 6,232,212 B1* | 5/2001 | Degani et al. | 438/612 |
| 6,298,551 B1 | 10/2001 | Wojnarowski et al. | |
| 6,332,988 B1 | 12/2001 | Berger, Jr. et al. | |
| 6,339,024 B1* | 1/2002 | Petrarca et al. | 438/686 |
| 6,346,469 B1 | 2/2002 | Greer | |
| 6,362,090 B1 | 3/2002 | Paik et al. | |
| 6,365,956 B1 | 4/2002 | Nonaka | |
| 6,380,555 B1 | 4/2002 | Hembree et al. | |
| 6,415,974 B2 | 7/2002 | Jao | |
| 6,475,896 B1 | 11/2002 | Hashimoto | |
| 6,492,197 B1 | 12/2002 | Rinne | |
| 6,521,996 B1 | 2/2003 | Seshan | |
| 6,522,021 B2 | 2/2003 | Sakihama et al. | |
| 6,578,754 B1 | 6/2003 | Tung | |
| 6,592,019 B2 | 7/2003 | Tung | |
| 6,596,624 B1 | 7/2003 | Romankiw | |
| 6,605,524 B1* | 8/2003 | Fan et al. | 438/613 |
| 6,622,907 B2 | 9/2003 | Fanti et al. | |
| 6,703,069 B1* | 3/2004 | Moon et al. | 427/123 |
| 6,717,262 B1 | 4/2004 | Moriizumi et al. | |
| 6,806,578 B2 | 10/2004 | Howell et al. | |
| 6,822,327 B1 | 11/2004 | Mithal et al. | |
| 6,878,465 B2* | 4/2005 | Moon et al. | 428/650 |
| 6,921,716 B2 | 7/2005 | Huang et al. | |
| 6,924,553 B2 | 8/2005 | Ohara | |
| 6,974,659 B2* | 12/2005 | Su et al. | 430/312 |
| 7,071,554 B2* | 7/2006 | Hussein et al. | 257/737 |
| 7,081,404 B2 | 7/2006 | Jan et al. | |
| 7,081,679 B2 | 7/2006 | Huang et al. | |
| 7,087,458 B2 | 8/2006 | Wang et al. | |
| 7,095,045 B2 | 8/2006 | Chiba et al. | |
| 7,208,402 B2 | 4/2007 | Bohr et al. | |
| 7,208,843 B2 | 4/2007 | Richling et al. | |
| 7,325,716 B2 | 2/2008 | Debelius et al. | |
| 7,328,830 B2 | 2/2008 | Bachman et al. | |
| 7,329,951 B2 | 2/2008 | Daubenspeck et al. | |
| 7,411,306 B2 | 8/2008 | Leu et al. | |
| 7,485,564 B2 | 2/2009 | Daubenspeck et al. | |
| 7,541,272 B2 | 6/2009 | Daubenspeck et al. | |
| 7,579,694 B2 | 8/2009 | Jan et al. | |
| 7,812,448 B2 | 10/2010 | Ramanathan et al. | |
| 7,816,787 B2 | 10/2010 | Wang | |
| 7,935,408 B2 | 5/2011 | Daubenspeck et al. | |
| 7,939,390 B2 | 5/2011 | Ayotte et al. | |
| 7,964,961 B2 | 6/2011 | Lee et al. | |
| 7,969,003 B2 | 6/2011 | Huang | |
| 8,003,512 B2* | 8/2011 | Belanger et al. | 438/612 |
| 8,232,193 B2 | 7/2012 | Chang | |
| 8,237,276 B2 | 8/2012 | Song et al. | |
| 8,294,269 B2 | 10/2012 | Nair et al. | |
| 2002/0000668 A1 | 1/2002 | Sakihama et al. | |
| 2002/0056910 A1 | 5/2002 | Howell et al. | |
| 2002/0077798 A1 | 6/2002 | Inoue et al. | |
| 2002/0093098 A1 | 7/2002 | Barr et al. | |
| 2002/0096764 A1 | 7/2002 | Huang | |
| 2002/0100975 A1 | 8/2002 | Kanda | |
| 2002/0111009 A1* | 8/2002 | Huang et al. | 438/613 |
| 2002/0149105 A1 | 10/2002 | Yoon et al. | |
| 2003/0025202 A1 | 2/2003 | Mikagi et al. | |
| 2003/0025203 A1 | 2/2003 | Akram et al. | |
| 2003/0027379 A1 | 2/2003 | Liu | |
| 2003/0030142 A1 | 2/2003 | Nakatani | |
| 2003/0052409 A1 | 3/2003 | Matsuo et al. | |
| 2003/0052415 A1 | 3/2003 | Boettcher et al. | |
| 2003/0057551 A1 | 3/2003 | Datta et al. | |
| 2003/0080420 A1 | 5/2003 | Ohara | |
| 2003/0102551 A1 | 6/2003 | Kikuchi | |
| 2003/0124833 A1 | 7/2003 | Tong et al. | |
| 2003/0127734 A1 | 7/2003 | Lee et al. | |
| 2003/0183933 A1 | 10/2003 | Kobayashi | |
| 2003/0186487 A1 | 10/2003 | Hogerl | |
| 2003/0189249 A1 | 10/2003 | Tong et al. | |
| 2003/0211720 A1 | 11/2003 | Huang et al. | |
| 2004/0008049 A1 | 1/2004 | Figueras et al. | |
| 2004/0094837 A1 | 5/2004 | Greer | |
| 2004/0113272 A1 | 6/2004 | Chen et al. | |
| 2004/0130034 A1 | 7/2004 | Alvarez | |
| 2004/0134974 A1 | 7/2004 | Oh et al. | |
| 2004/0159944 A1 | 8/2004 | Datta et al. | |
| 2004/0178503 A1 | 9/2004 | Jin et al. | |
| 2004/0222522 A1 | 11/2004 | Homma | |
| 2004/0227239 A1 | 11/2004 | Murata et al. | |
| 2004/0238955 A1 | 12/2004 | Homma et al. | |
| 2005/0070085 A1* | 3/2005 | Huang et al. | 438/614 |
| 2005/0140006 A1 | 6/2005 | Takahashi | |
| 2005/0212133 A1 | 9/2005 | Barnak et al. | |
| 2005/0275097 A1 | 12/2005 | Min-Lung | |
| 2006/0012039 A1 | 1/2006 | Kim et al. | |
| 2006/0016861 A1 | 1/2006 | Daubenspeck et al. | |
| 2006/0017160 A1 | 1/2006 | Huang | |
| 2006/0030139 A1 | 2/2006 | Mis et al. | |
| 2006/0055013 A1 | 3/2006 | Ito et al. | |
| 2006/0055037 A1 | 3/2006 | Park et al. | |
| 2006/0076677 A1 | 4/2006 | Daubenspeck et al. | |
| 2006/0087034 A1 | 4/2006 | Huang et al. | |
| 2006/0088992 A1 | 4/2006 | Huang et al. | |
| 2006/0094226 A1 | 5/2006 | Huang et al. | |
| 2006/0214292 A1 | 9/2006 | Agraharam et al. | |
| 2006/0244139 A1 | 11/2006 | Daubenspeck et al. | |
| 2006/0249848 A1 | 11/2006 | Coolbaugh et al. | |
| 2007/0001301 A1 | 1/2007 | Wang | |
| 2007/0001302 A1 | 1/2007 | Morita et al. | |
| 2007/0001317 A1 | 1/2007 | Matsuoka et al. | |
| 2007/0023923 A1 | 2/2007 | Salmon | |
| 2007/0045840 A1 | 3/2007 | Varnau | |
| 2007/0052109 A1 | 3/2007 | Chen et al. | |
| 2007/0075423 A1 | 4/2007 | Ke et al. | |
| 2007/0085204 A1 | 4/2007 | Korec et al. | |
| 2007/0096313 A1 | 5/2007 | Chou et al. | |
| 2007/0102815 A1 | 5/2007 | Kaufmann et al. | |
| 2007/0111499 A1 | 5/2007 | Lo | |
| 2007/0111502 A1 | 5/2007 | Daubenspeck et al. | |
| 2007/0117368 A1 | 5/2007 | Tsai et al. | |
| 2007/0184579 A1 | 8/2007 | Huang et al. | |
| 2007/0252274 A1 | 11/2007 | Daubenspeck et al. | |
| 2007/0264519 A1 | 11/2007 | Kinzer | |
| 2007/0283298 A1 | 12/2007 | Bernstein et al. | |
| 2007/0287279 A1 | 12/2007 | Daubenspeck et al. | |
| 2007/0290343 A1 | 12/2007 | Harada et al. | |
| 2008/0042271 A1 | 2/2008 | Dauksher et al. | |
| 2008/0067676 A1 | 3/2008 | Daubenspeck et al. | |
| 2008/0185716 A1 | 8/2008 | Huang | |
| 2008/0194095 A1 | 8/2008 | Daubenspeck et al. | |
| 2008/0249727 A1 | 10/2008 | Takase | |
| 2008/0265413 A1 | 10/2008 | Chou et al. | |
| 2008/0299757 A1* | 12/2008 | Wen | 438/614 |
| 2009/0032929 A1 | 2/2009 | Daubenspeck et al. | |
| 2009/0072396 A1 | 3/2009 | Wang | |
| 2009/0127710 A1 | 5/2009 | Daubenspeck et al. | |
| 2009/0201626 A1 | 8/2009 | Ayotte et al. | |
| 2010/0013082 A1 | 1/2010 | Lin | |
| 2010/0155943 A1 | 6/2010 | Carey et al. | |
| 2010/0164096 A1 | 7/2010 | Daubenspeck et al. | |
| 2010/0164104 A1 | 7/2010 | Daubenspeck et al. | |
| 2010/0193949 A1 | 8/2010 | Belanger et al. | |
| 2010/0203655 A1 | 8/2010 | Ayotte et al. | |
| 2010/0203685 A1 | 8/2010 | Daubenspeck et al. | |
| 2010/0219528 A1 | 9/2010 | Zhao et al. | |
| 2010/0233872 A1 | 9/2010 | Brofman et al. | |
| 2010/0258335 A1 | 10/2010 | Arvin et al. | |
| 2010/0263913 A1 | 10/2010 | Daubenspeck et al. | |
| 2011/0006422 A1 | 1/2011 | Daubenspeck et al. | |
| 2011/0062580 A1 | 3/2011 | Liu et al. | |
| 2011/0084381 A1 | 4/2011 | Lo et al. | |
| 2011/0147922 A1 | 6/2011 | Bezama et al. | |

(56) References Cited

U.S. PATENT DOCUMENTS

| | | | |
|---|---|---|---|
| 2011/0175220 A1 | 7/2011 | Kuo et al. | |
| 2011/0198748 A1 | 8/2011 | Koike | |
| 2011/0210441 A1 | 9/2011 | Lee et al. | |
| 2011/0233763 A1 | 9/2011 | Pendse et al. | |
| 2011/0233766 A1* | 9/2011 | Lin et al. | 257/737 |
| 2011/0254159 A1 | 10/2011 | Hwang et al. | |
| 2012/0007228 A1 | 1/2012 | Lu et al. | |
| 2012/0007230 A1 | 1/2012 | Hwang et al. | |
| 2012/0007233 A1 | 1/2012 | Kuo et al. | |
| 2012/0056322 A1 | 3/2012 | Saigoh et al. | |
| 2012/0061827 A1 | 3/2012 | Fujita | |
| 2012/0091576 A1 | 4/2012 | Tsai et al. | |

OTHER PUBLICATIONS

David Cleff, et al., "C-4 Makes Way for Electroplated Bumps", Advanced Packaging, Mar. (2001) whole article.*

Kulicke et al. "Flip Chip Division, Repassivation Design Guide", revision B, Nov. 15, 2001.*

Topacio, Roden "Polyimide-over-UBM Process: The Challenges and Solutions on Plating Bump Process" SMTA Inter. Conf. Proc. Oct. 24, 2010 abstract only.*

USPTO, final Office Action issued in U.S. Appl. No. 12/421,723 dated Mar. 28, 2012.

USPTO, Office Action issued in U.S. Appl. No. 12/421,723 dated Sep. 2, 2011.

USPTO, Office Action issued in related U.S. Appl. No. 12/963,139 dated Jan. 17, 2013.

USPTO, Office Action issued in related U.S. Appl. No. 12/963,139 dated Aug. 28, 2012.

USPTO, Notice of Allowance issued in related U.S. Appl. No. 12/640,752 dated Jan. 16, 2013.

USPTO, Office Action issued in related U.S. Appl. No. 12/640,752 dated Oct. 26, 2012.

USPTO, Office Action issued in related U.S. Appl. No. 12/640,752 dated Apr. 13, 2012.

"Mini-CU Vias for 3D Connections" IBM Technical Disclosure IPCOM000182403D, Anonymous, Apr. 29, 2009, pp. 1-4.

USPTO, Notice of Allowance issued in U.S. Appl. No. 13/873,801 dated Nov. 6, 2013.

USPTO, Office action issued in U.S. Appl. No. 13/873,801 dated Aug. 15, 2013.

Kang, S., et al., "Interfacial Reactions During Soldering with Lead-Tin Eutectic and Lead (Pb)-Free, Tin-Rich Solders", Journal of Electronic Materials, vol. 25, No. 7, 1996, pp. 1113-1120.

USPTO, Office Action issued in U.S. Appl. No. 13/433,974 dated Sep. 27, 2013.

USPTO, Office Action issued in U.S. Appl. No. 13/433,974 dated Mar. 18, 2013.

* cited by examiner

SOLDER BUMP CONNECTIONS

CROSS-REFERENCE TO RELATED APPLICATIONS

This application is a divisional of application Ser. No. 12/963,139, filed Dec. 8, 2010, which is hereby incorporated by reference herein in its entirety.

BACKGROUND

The invention relates generally to semiconductor structures and fabrication of semiconductor chips and, in particular, to solder bump connections and methods for fabricating solder bump connections during back-end-of-line (BEOL) processing of semiconductor chips.

A chip or die includes integrated circuits formed by front-end-of-line (FEOL) processing and metallization levels of an interconnect structure formed by back-end-of line (BEOL) processing. Chips are then packaged and mounted on a circuit board. Solder bumps are commonly utilized to provide mechanical and electrical connections between the last or top metallization level and the circuit board. A common type of solder bump is the controlled collapse chip connection (C4) solder bump. Controlled Collapse Chip Connection (C4) processes are well known in forming solder bumps in semiconductor fabrication. During assembly of the chip and circuit board, C4 solder bumps establish physical attachment and electrical contact between an array of C4 pads on the chip and a complementary array of C4 pads on the circuit board.

Conventional solder bump connections rely on a group of metallic layers know as the Ball Limiting Metallurgy (BLM) to promote the attachment of the C4 solder bump to the chip. Among the functions of the BLM are to promote adhesion between the underlying dielectric passivation layer and the metal pad, to promote solder wetting, and to act as a solder diffusion barrier.

Improved solder bump connections and fabrication methods are needed that improve on conventional solder bump connections and methods.

BRIEF SUMMARY

In an embodiment of the invention, a method is provided for fabricating a solder bump connection. The method includes forming a layer stack containing a first conductive layer and a second conductive layer on the first layer, forming a dielectric passivation layer on a top surface of the second conductive layer, and forming a via opening extending through the dielectric passivation layer to the top surface of the second conductive layer. The method further includes forming a conductive plug in the via opening.

In an embodiment of the invention, a solder bump connection includes a first conductive layer, a second conductive layer on the first conductive layer, and a dielectric passivation layer on a top surface of the second conductive layer. The first and second conductive layers are respectively comprised of first and second conductors. A via opening extends through the dielectric passivation layer to the top surface of the second conductive layer. A conductive plug is disposed in the via opening.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
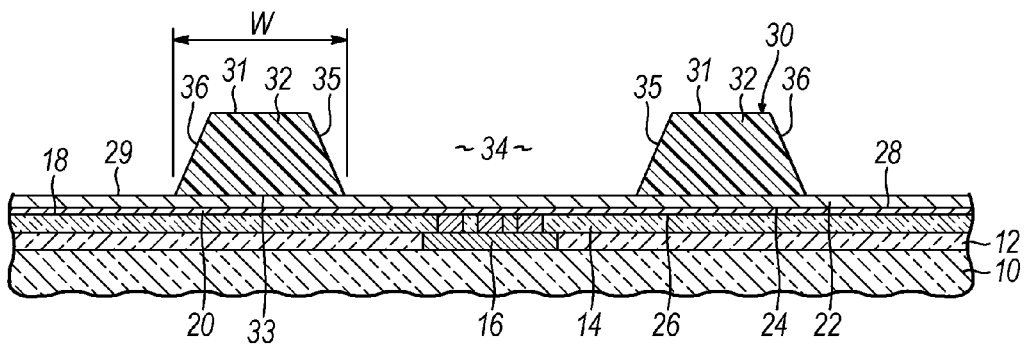
FIGS. 1-5 are cross-sectional views of a portion of a substrate at an initial fabrication stage of a processing method for fabricating a device structure in accordance with an embodiment of the invention.

With reference to FIG. 1 and in accordance with an embodiment of the invention, a plurality of dielectric layers 10, 12, 14 and a metal line 16 embedded as metallization in one or more of the dielectric layers 10, 12, 14 represents features in a topmost level of a back-end-of-line (BEOL) interconnect structure. Typical constructions for the BEOL interconnect structure consist of about two (2) to about eight (8) metallization levels. The metallization levels of the BEOL interconnect structure are formed by known lithography and etching techniques characteristic of damascene processes conventionally associated with BEOL processing.

Each of the dielectric layers 10, 12, 14 may comprise any suitable organic or inorganic dielectric material recognized by a person having ordinary skill in the art and at least dielectric layers 12 and 14 should be capable of withstanding high sheer stress. Candidate inorganic dielectric materials may include, but are not limited to, silicon dioxide, fluorine-doped silicon glass (FSG), and combinations of these dielectric materials. Alternatively, the dielectric material of one or more of the dielectric layers 10, 12, 14 may be characterized by a relative permittivity or dielectric constant smaller than the dielectric constant of silicon dioxide, which is about 3.9. Candidate low-k dielectric materials include, but are not limited to, porous and nonporous spun-on organic low-k dielectrics, such as spin-on aromatic thermoset polymer resins like polyarylenes, porous and nonporous inorganic low-k dielectrics like organosilicate glasses, hydrogen-enriched silicon oxycarbide (SiCOH), and carbon-doped oxides, and combinations of these and other organic and inorganic dielectrics. The dielectric layers 10, 12, 14 may be deposited by any number of well known conventional techniques such as sputtering, spin-on application, chemical vapor deposition (CVD) process or a PECVD process.

The metal line 16 may be comprised of copper, aluminum, or an alloy of these materials, and may be formed by a damascene process in dielectric layers 12, 14. The metal line 16 may be configured to limit current crowding with a set of metal-filled TV (terminal via) slots.

The BEOL interconnect structure is carried on a die or chip (not shown) that has been processed by front-end-of-line (FEOL) processes to fabricate one or more integrated circuits that contain device structures. The chip may be formed from any suitable wafer of semiconductor material that a person having ordinary skill in the art would recognize as suitable for integrated circuit fabrication.

A layer stack consisting of an adhesion layer 20 and a seed layer 22 is formed on a top surface 18 of dielectric layer 14. A bottom surface 24 of seed layer 22 directly contacts a top surface 28 of adhesion layer 20 so that layers 20, 22 are in physical and electrical contact. A bottom surface 26 of adhesion layer 20 contacts, preferably directly, the top surface 18 of dielectric layer 14 and is in physical and electrical contact with the metal line 16. In one embodiment, the thickness of adhesion layer 20 ranges between 0.1 μm and 0.3 μm in thickness, preferably about 0.2 μm, and the thickness of seed layer 22 ranges from 0.25 μm to 1.0 μm, preferably about 0.5 μm.

Figure 5:
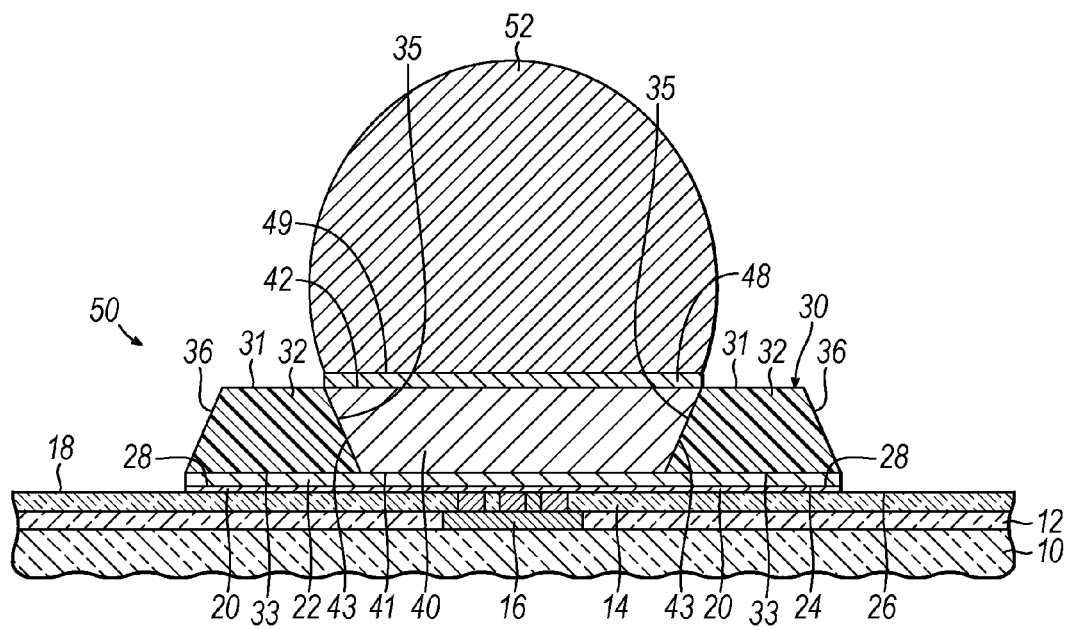

The layers 20, 22 are components of Ball Limiting Metallurgy (BLM) or Under Bump Metallurgy (UBM) used in the construction of the solder bump connection 50 (FIG. 5). The adhesion layer 20 may be comprised of a material that is thermally stable during BEOL processes and that adheres well with the subsequently-formed plug 40 (FIG. 2) for strengthening the bond with the dielectric layer 14 and metal line 16. The material of the adhesion layer 20 may also be capable of blocking the drift or diffusion of atoms from the material of plug 40 into the dielectric layer 14. In one embodiment, the adhesion layer 20 may be comprised of an alloy of titanium and tungsten (TiW). In alternate embodiments, the adhesion layer 20 may include other materials, such as a conductive metal nitride selected from titanium nitride (TiN), tantalum (Ta), tantalum nitride (TaN), a tungsten nitride ($WN_x$), or multilayer combination of these materials (e.g., a bilayer of TaN/Ta) as recognized by a person having ordinary skill in the art. In one embodiment, seed layer 22 may be comprised of copper, such as a thin layer of copper (Cu) or co-deposited chromium-copper (Cr—Cu).

Layers 20, 22 of the layer stack may be serially deposited utilizing physical vapor deposition (PVD) techniques or other deposition techniques understood by a person having ordinary skill in the art. Prior to deposition of the adhesion layer 20, the top surface 18 of dielectric layer 14 may be prepared by a degas process, precleaned with a plasma etch for, etc.

A dielectric passivation layer 30 is formed on a top surface 29 of seed layer 22. The dielectric passivation layer 30 may be comprised of an organic material, such as a polymer, that is optionally photosensitive. In one embodiment, the dielectric passivation layer 30 may be comprised of photosensitive polyimide (PSPI). The dielectric passivation layer 30 may be prepared by dissolving the polymer in a solvent to form a precursor, spreading the precursor with a spin coating process as a coating across seed layer 22, and then drying the coating to remove solvents from the precursor coating and partially imidize the polymer.

Figure 1A:
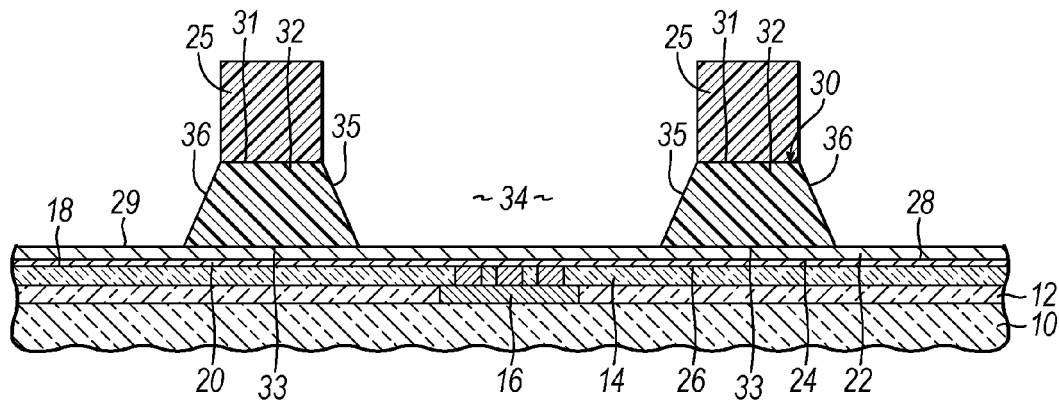
FIG. 1A is a cross-sectional view similar to FIG. 1 in accordance with an alternative embodiment of the invention.

A final via (FV) opening 34 is formed in the dielectric passivation layer 30. The FV opening 34 extends through the entire layer thickness of the dielectric passivation layer 30 to expose a portion of the top surface 29 of seed layer 22. The location of the FV opening 34 defines the intended location on dielectric layer 14 for forming the solder bump connection 50. If the dielectric passivation layer 32 is a non-photosensitive material, a photoresist may be spun onto the dielectric passivation layer 32, exposed using radiation projected through a photomask, and then developed to provide a pattern of islands 25 of photoresist distributed across the top surface 29 of the seed layer 22 at intended locations for the solder bump connections, as shown in FIG. 1A. The island pattern is transferred from the photoresist into the dielectric passivation layer 30 with a wet chemical etch process. If the dielectric passivation layer 32 is a photosensitive material, the dielectric passivation layer 32 may be lithographically patterned by radiation exposure and development. The precursor coating is subsequently cured to imidize and crosslink the polymer.

An annular island region 32 of the dielectric passivation layer 30 remains on the top surface 29 of seed layer 22. The island region 32 includes an inner sidewall 35 that surrounds the FV opening 34, an outer sidewall 36, a bottom surface 33 at the base of the island region 32, and a top surface 31 opposite to the bottom surface 33. The island region 32 has a frustoconical shape in which the sidewalls 35, 36 are tapered from the bottom surface 33 toward the top surface 31. Outside of the island region 32, the top surface 29 of seed layer 22 is also revealed when the dielectric passivation layer 30 is patterned. In one embodiment, the thickness of the dielectric passivation layer 30 may be in a range of 10 μm to 15 μm.

In the process flow, the layer stack of adhesion layer 20 and seed layer 22 are formed before the island region 32 in dielectric passivation layer 30. As a result, the inner sidewall 35 of the island region 32 is not covered by the adhesion layer 20 and seed layer 22 and, hence, is free of the layer stack. The adhesion layer 20 and seed layer 22 are present between a bottom surface of the island region 32 and the top surface 18 of the dielectric layer 14. Preferably, the bottom surface 33 of the dielectric passivation layer 30 is directly formed on the top surface 29 of seed layer 22. At the bottom surface 33, the width, w, of the island region 32 measured between the corners of the sidewalls 35, 36 may range from 5 μm to 100 μm.

Figure 2:
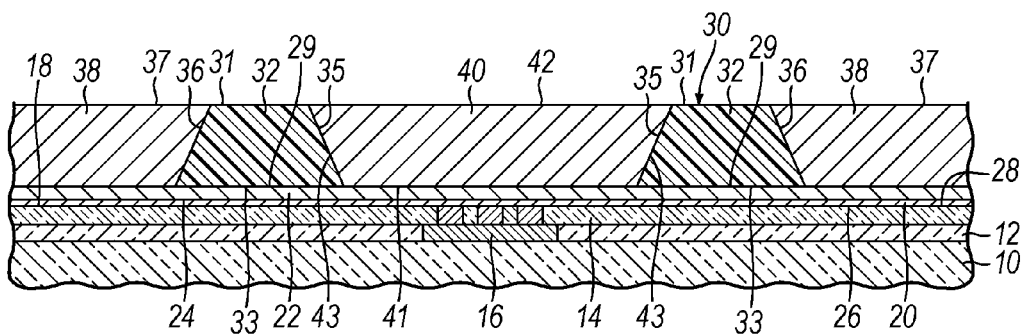

With reference to FIG. 2 in which like reference numerals refer to like features in FIG. 1 and at a subsequent fabrication stage, a conductive layer 38 comprised of a conductor is formed on top surface 29 of seed layer 22 in surface areas across which the dielectric passivation layer 30 is absent. A representative conductor for conductive layer 38 is comprised of copper (Cu), although other suitable low-resistivity materials like metals and metal alloys may be selected in alternative embodiments. The conductive layer 38 may be deposited by a conventional deposition process, such as an electrochemical plating process like electroplating. In an electrochemical plating process, the seed layer 22 operates as a catalyst to nucleate the formation of the conductor constituting layer 38. The material in seed layer 22 may be subsumed during the deposition process, such that the seed layer 22 may become continuous with or blend into conductive layer 38. A segment of the seed layer 22 remains disposed beneath the island region 32 of the dielectric passivation layer 30. The dielectric passivation layer 30 may remain uncoated by the conductor in conductive layer 38.

Following deposition, a plug 40 comprised of the conductor resides inside the FV opening 34 and constitutes a component of the BLM. The plug 40 is surrounded or circumscribed by the inner sidewall 35 of the island region 32 of dielectric passivation layer 30 and the plug 40 directly contacts the inner sidewall 35 of the FV opening 34. The plug 40 has a diameter approximately equal to the diameter of the FV opening 34 at any point along its height. The plug 40 has a tapered sidewall 43 that is in direct physical contact with the inner sidewall 35 of the island region 32 due to the absence of layers 20, 22 on the inner sidewall 35. A bottom surface 41 of the plug 40 in is direct physical and electrical contact with the top surface 29 of the seed layer 22. Alternatively, if the seed layer 22 is subsumed into the material of the plug 40, the bottom surface 41 of the plug 40 and the top surface 28 of the adhesion layer 20 can be considered to be in physical and electrical contact. The plug 40 residing in the FV opening 34 and the dielectric passivation layer 30 have approximately equal thicknesses. The nominal diameter of the plug 40, which is determined by the diameter of the FV opening 34, may be selected contingent upon the solder bump connection design dimensions and, in some embodiments, the nominal width of the plug 40 measured at the bottom surface 41 may range from 10 μm to 500 μm.

The plug 40 may be formed and have a thickness equal to the thickness of the dielectric passivation layer 30 without the need for a chemical mechanical polishing (CMP) process as required by conventional processes for forming pad constructions. In particular, the placement of the layers 20, 22 as a layer stack on the surface of the dielectric layer 14 and the formation of the layers 20, 22 before the dielectric passivation layer 30 is formed facilitates the elimination of the CMP process. The layer stack of layers 20, 22 is disposed between the dielectric passivation layer 30 and the dielectric layer 14. In conventional process flows, the dielectric passivation layer is formed and the FV opening is defined before the BLM layer stack is formed. As a result, the conventional BLM layer stack must be removed with a CMP process from the top surface of the dielectric passivation layer after the plug is formed in the FV opening.

Figure 3:
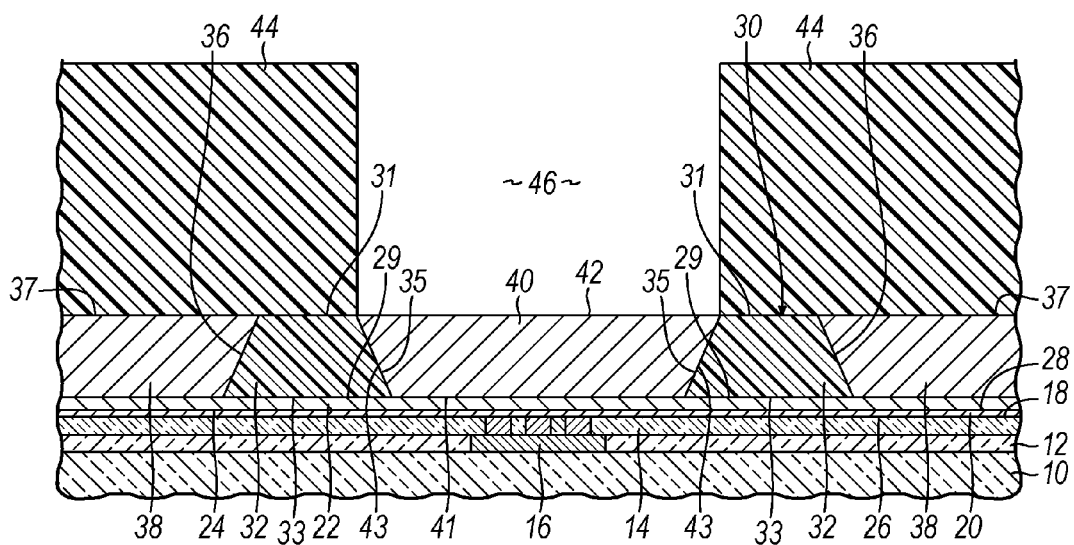

With reference to FIG. 3 in which like reference numerals refer to like features in FIG. 2 and at a subsequent fabrication stage, a plating resist mask 44 is formed on the top surface 31 of the dielectric passivation layer 30 and a top surface 37 of conductive layer 38 by applying a resist layer, exposing the resist layer to radiation through a photomask, and developing the exposed resist layer to define an unmasked window 46 exposing a top surface 42 of the plug 40. In one embodiment, the plating resist mask 44 is a photoactive polymer resist, such as RISTON® photopolymer resist that has an optimal exposure response to ultraviolet radiation in the 350 nm to 380 nm range and that can be developed in a carbonate-based solution.

Figure 4:
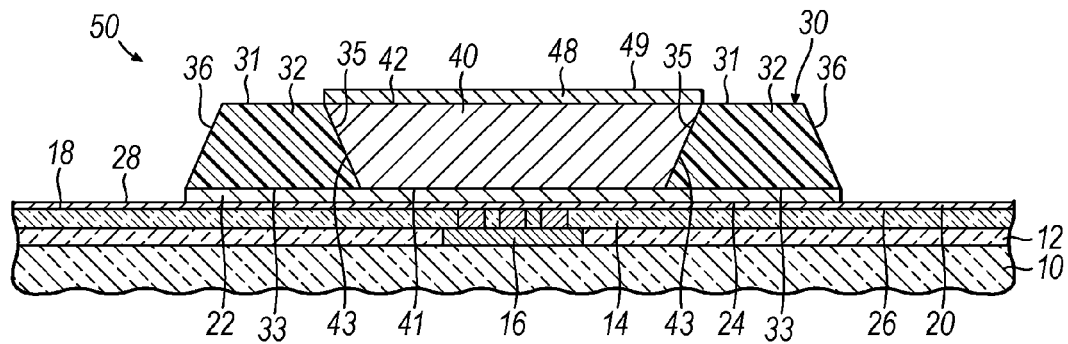

With reference to FIG. 4 in which like reference numerals refer to like features in FIG. 3 and at a subsequent fabrication stage, a barrier layer 48 of the BLM is applied to the top surface 42 of the plug 40 that is exposed through the window 46 in the plating resist mask 44 (FIG. 3). Barrier layer 48 does not form on regions of the conductive layer 38 covered by the plating resist mask 44 and defines a cap on the plug 40. In a representative embodiment, barrier layer 48 may be comprised of a metal formed by a deposition technique, such as nickel (Ni) or a Ni alloy (e.g., NiCo) formed by an electrochemical plating process (e.g., electroplating) to a thickness with a range of 0.5 µm to 4 µm and, preferably, to a thickness of 2 µm. The layer arrangement promotes the electroplating of the barrier layer 48 in contrast to the electroless deposition required in conventional solder bump connection fabrication processes. An optional layer (not shown) of a different material, such as about 1 µm of Cu, may be applied to a top surface 49 of the barrier layer 48. The dimensions of the barrier layer 48 and the top surface 42 of the plug 40 match a specification for solder bumping and, in particular, may match the known C4 solder bumping specification. For example, the barrier layer 48 and the top surface 42 of the plug 40 may have a diameter on the order of the dimensions of the solder bump 52 (FIG. 5) and, in particular, a diameter ranging from 20 µm to 500 µm.

Because of the residence of the plug 40 in the FV opening 34 and the circumscription of the plug 40 by the island region 32 of dielectric passivation layer 30, the process forming the barrier layer 48 is self-aligned with the top surface 42 of the plug 40. The plug 40 and the barrier layer 48 are in direct physical and electrical contact.

The plating resist mask 44 is then stripped from the top surfaces 31, 37 in a conventional manner. For example, if the plating resist mask 44 is comprised of a photoactive polymer resist, such as RISTON®, stripping may be executed using an aqueous stripping solution or a proprietary commercial stripping solution.

Field regions of the conductive layer 38 and layer 22 between adjacent solder bump connections 50 (FIG. 5) are removed from the top surface of adhesion layer 20. In one embodiment in which the conductive layer 38 and seed layer 22 are comprised of Cu, the field regions of the conductive layer 38 may be removed by exposure to an isotropic wet chemical etchant, such as a solution of hydrogen peroxide and sulfuric acid. The wet chemical etchant removes the material of conductive layer 38 and seed layer 22 at a higher etch rate than the material of barrier layer 48 so that the plug 40 residing in the FV opening 34 and layer 48 are substantially unaffected by the wet chemical etchant.

With reference to FIG. 5 in which like reference numerals refer to like features in FIG. 4 and at a subsequent fabrication stage, field regions of the adhesion layer 20 on the top surface 18 of dielectric layer 14 at locations not masked by the overlying dielectric passivation layer 30 and plug 40 are removed. In one embodiment, these regions of the adhesion layer 20 may be removed using an isotropic wet chemical etching process. For example, if the adhesion layer 20 is comprised of TiW, a representing wet etch process may use an etchant comprised of a hydrogen peroxide ($H_2O_2$) chemistry with end-point detection control. The patterning of the adhesion layer 20 may complete the formation of an interconnect structure in the form of the solder bump connection 50. During BEOL processing, the solder bump connection 50 is replicated across at least a portion of the surface area of the wafer.

A solder ball or bump 52 is formed on the top surface 49 of the barrier layer 48. The solder bump 52 may be comprised of solder having a conventional lead-free (Pb-free) composition, which may include tin (Sn) as the primary elemental component. In a representative embodiment, the solder bump 52 may be separately formed and transferred to the top surface 49 of the barrier layer 48 by a Controlled Collapse Chip Connection New Process (C4NP) technology, which promotes Pb-free wafer bumping. The solder bump 52 is included among an area array of injection-molded solder bumps that are formed using bulk Pb-free solder injected into cavities in a mold plate matching the locations of solder bump connections, including solder bump connection 50, on the wafer. The molded bumps populating the cavities are transferred to the wafer by precisely aligning the bumps with the solder bump connections and executing a reflow transfer by heating in reducing gas atmosphere to a temperature that is 10° C. to 20° C. above the solder melting temperature. The reflow of the solder bump 52 tends to combine with the material of the barrier layer 48 to form a stable intermetallic composition. The optional layer applied to top surface 49 of the barrier layer 48, as described above, may assist in driving the transfer of the solder bump 52 to the barrier layer 48.

The solder bump 52 protrudes vertically above the level of the top surfaces 31, 37 of the dielectric passivation layer 30 and the plug 40. The height of the solder bump 52 may be on the order of 50 µm. The top surface 49 of the barrier layer 48 operates as a support pad for the solder bump 52. The barrier layer 48, plug 40, and adhesion layer 20 provide a conductive path between the metal line 16 and the solder bump 52. The barrier layer 48 protects the material (e.g., Cu) of the underlying plug 40 against consumption during reflow processes from reactions with the solder bump 52.

After the solder bump 52 is reflowed on the solder bump connection 50, a flip-chip assembly process may be performed. The chip (not shown) is inverted and aligned relative to a laminate substrate (not shown). The solder bumps, including solder bump 52, are bonded to the matching pads on the laminate substrate using a reflow process. The temperature of the reflow process is contingent upon solder composition but is typically in a range of 200° C. to 300° C. Eventually, the solder bump 52 and solder bump connection 50 are components contributing to pathways for transferring data from the chip to an external device, such as a computing system, and for powering the integrated circuits on the chip.

Figure 6:
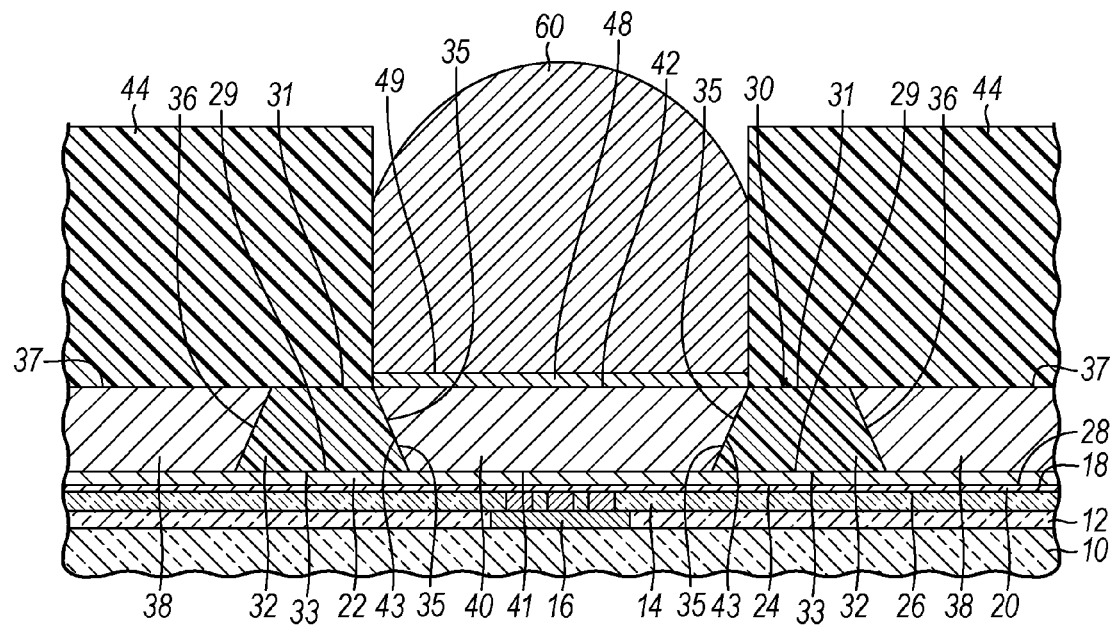
FIG. 6 is a cross-sectional view similar to FIG. 5 in accordance with an alternative embodiment of the invention.

With reference to FIG. 6 in which like reference numerals refer to like features in FIG. 3 and at a subsequent fabrication stage in accordance with an alternative embodiment, the process flow proceeds as described above to the stage shown in FIG. 3, including forming the barrier layer 48. With the plating resist mask 44 still intact and prior to its removal, a solder bump 60 is formed on the barrier layer 48. The window 46 in the plating resist mask 44 defines the lateral location of the solder bump 60. The solder bump 60 may be deposited by a conventional deposition process, such as an electrochemical plating process like electroplating or electroless plating. As described above, the plating resist mask 44 is stripped from the top surface 31 of dielectric passivation layer 30 and the top surface 37 of conductive layer 38 in a conventional manner. The process flow continues by removing regions of conductive layer 38 not covered by the regions of adhesion layer 20 and removing regions of adhesion layer 20 that are not covered by the dielectric passivation layer 30 and plug 40, as described above. In this alternative embodiment of the process flow, the solder bump 60 assists in masking the plug 40 during the wet etch process removing the field regions of conductive layer 38. The solder bump 60 is reflowed using a conventional reflow process to form a spherical shape, which results in the final structure of the solder bump connection 50 depicted in FIG. 5.

The process flow in accordance with the embodiments of the invention eliminates several steps from a conventional process flow. Specifically, the conventional process flow introduces a pedestal as an independent and distinct structure underlying a conventional plug and with a separate set of steps in the conventional process of record. In contrast, the plug 40 operates as an integral, one-piece pedestal/plug structure that can be formed with at least four fewer operations than in a conventional process flow. Specifically, though the process flow of the embodiments of the invention would not eliminate a masking step, the conventional process flow is simplified by eliminating at least two PVD processes used to form barrier and seed layers, a plating process to deposit the conductive material of the pedestal on the barrier and seed layers, and a CMP process to planarized the conductive material to shape the pedestal. In addition to eliminating the independent formation of a pedestal and a plug, the process flow introduces a common metal base layers 20, 22 under the relatively thick plug 40, instead of multiple layers in a stack containing a separate pedestal and plug.

The plug 40 is encapsulated by the dielectric passivation layer 30 and the barrier layer 48 to form a protective envelop. Specifically, the island region 32 of dielectric passivation layer 30 is laterally disposed between the plug 40 and the surrounding environment and the top surface 42 of the plug 40 is capped by layer 48. As a result, the plug 40 is shielded and protected against thermal undercut during reflow because the molten solder does not contact the plug 40 and, as a result, the material of the plug 40. The potential for thermal undercut, which is eliminated by the inventive construction, is particularly acute between Sn in Pb-free solders forming the solder bump 52 and any exposed Cu.

The edges at the perimeter of the adhesion layer 20 are displaced laterally from the bottom surface 41 of the plug 40 by the width of the island region 32 of dielectric passivation layer 30. When the adhesion layer 20 is wet etched, any recession of the peripheral edges of the adhesion layer 20 beneath the island region 32 of dielectric passivation layer 30 are displaced from the location at which the adhesion layer 20 underlies the plug 40. When the seed layer 22 is wet etched, any recession of the peripheral edges of the seed layer 22 beneath the island region 32 of dielectric passivation layer 30 are displaced from the bottom surface 41 of the plug 40. As a result, any recession of the layers 20, 22 during wet chemical etching does not penetrate beneath the dielectric passivation layer 30 along the top surface 18 of dielectric layer 14 to a location proximate to the bottom surface 41 of the plug 40. In particular, the recession of layers 20, 22 may only penetrate inward from the outer sidewall 36 of the island region by a distance of 2 µm or 3 µm, which is less than the width, w, of the island region 32 at its bottom surface 33 (5 µm to 100 µm). Therefore, the plug 40 is not undercut during wet chemical etching and any undercutting of the island region 32 due to etching-induced recession of layers 20, 22 is displaced laterally from the plug 40.

The solder bump connection 50 of the embodiments of the invention physically separates the tensile base of the solder bump 52 from the locations of potential undercutting when the layers 20, 22 are wet etched. The physical separation may reduce the incidence of cracking resulting from chip-package interaction (CPI) during the flip-chip assembly process. During the cool-down phase of the thermal cycle in the flip-chip assembly process described above and subsequent reliability tests, module-level stresses develop because of mismatches in coefficients of thermal expansion (CTEs) between the materials of the chip and the laminate substrate. These stresses may be translated through a pad/bump assembly into the BEOL interconnect structure, which can drive crack initiation and propagation. The susceptibility of the BEOL interconnect structure to cracking may be exacerbated by the implementation of ultra low-k dielectrics and Pb-free solders.

The use of the island mask in forming the dielectric passivation layer 30 promotes the dielectric passivation layer 30 to be thickened, all other factors such as bump height being unchanged, in comparison with dielectric passivation layers found in conventional constructions. Solder bumps normally provide a gap between the chip and the laminate substrate. The enhanced thickness of the dielectric passivation layer 30 and plug 40 operates to further elevate a bottom surface of the chip and to increase the height of the gap. As a result, underfill material may be more readily drawn by capillary action from dispense locations along the edges of the chip into the gap underneath the chip, which facilitates underfilling operations.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. The chip may be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of fabricating a solder bump connection, the method comprising:
    forming a layer stack containing a first conductive layer and a second conductive layer on the first conductive layer;
    forming a dielectric passivation layer in an island region on a top surface of the second conductive layer, wherein the island region includes an inner sidewall and an outer sidewall;
    forming a via opening extending through the dielectric passivation layer to the top surface of the second conductive layer and circumscribed by the inner sidewall of the island region;
    forming a conductive plug in the via opening that is coupled by the second conductive layer with the first conductive layer; and
    after the conductive plug is formed, removing field regions of the layer stack outside of the outer sidewall of the island region with a selective wet chemical etching process.

2. The method of claim 1 further comprising:
    forming a dielectric layer; and
    forming a metal line in the dielectric layer that contacts the first conductive layer;
    wherein the dielectric passivation layer is arranged relative to the dielectric layer such that the layer stack is disposed in part between the dielectric passivation layer and the dielectric layer.

3. The method of claim 2 wherein the dielectric passivation layer and the conductive plug have approximately equal thicknesses.

4. The method of claim 1 wherein the dielectric passivation layer is comprised of a photosensitive polyimide (PSPI), the first conductive layer is comprised of titanium-tungsten (TiW) or a bilayer of tantalum nitride (TaN) and tantalum (Ta), the second conductive layer is comprised of copper, and the conductive plug is comprised of copper.

5. The method of claim 1 wherein the dielectric passivation layer and the conductive plug have approximately equal thicknesses.

6. The method of claim 5 wherein the approximately equal thicknesses are in a range of 10 µm to 15 µm.

7. The method of claim 1 wherein the conductive plug has a bottom surface directly contacting the top surface of the second conductive layer, and the conductive plug is separated from a dielectric layer by at least the second conductive layer.

8. The method of claim 1 wherein the conductive plug includes a sidewall in direct physical contact with the inner sidewall of the island region.

9. The method of claim 8 wherein the inner sidewall of the island region is free of the first conductive layer and the second conductive layer.

10. The method of claim 8 wherein the sidewall of the conductive plug and the inner sidewall of the island region are each tapered relative to the top surface of the second conductive layer.

11. The solder bump connection of claim 8 wherein the sidewall of the conductive plug and the inner sidewall of the island region has approximately equal diameters over a height of the via opening.

12. The solder bump connection of claim 8 wherein the inner sidewall of the island region is laterally between the conductive plug and the outer sidewall of the island region.

13. The method of claim 1 further comprising:
    capping the conductive plug with a third conductive layer; and
    forming a solder bump on the third conductive layer.

14. The method of claim 13 wherein the third conductive layer is comprised of a material that blocks reactions between the solder bump and the conductive plug during reflow processes, and capping the conductive plug with the third conductive layer comprises:
    electroplating the third conductive layer on the conductive plug.

15. The method of claim 13 wherein the third conductive layer and the top surface of the conductive plug are self-aligned so that the third conductive layer and the top surface of the conductive plug are coextensive.

16. The method of claim 1 further comprising:
    capping the conductive plug with a third conductive layer; and
    masking the conductive plug with the third conductive layer during the selective wet chemical etching process.

17. The method of claim 1 wherein the solder bump connection is formed without use of a conventional chemical mechanical polishing (CMP) process to remove the layer stack after the conductive plug is formed.

18. A method of fabricating a solder bump connection, the method comprising:
    forming a layer stack containing a first conductive layer and a second conductive layer on the first conductive layer;
    forming a passivation layer comprised of a coating of a non-photosensitive polymer on a top surface of the second conductive layer;
    forming an island mask on the coating at an intended location of the solder bump connection;
    etching unmasked regions of the coating to define an island region of the passivation layer from the coating beneath the island mask and that circumscribes a via opening extending through the passivation layer to the top surface of the second conductive layer; and
    forming a conductive plug in the via opening that is coupled by the second conductive layer with the first conductive layer.

19. The method of claim 18 wherein the island region includes an inner sidewall circumscribing the via opening and an outer sidewall.

20. The method of claim 1 further comprising:
forming a plating resist mask on a top surface of the dielectric passivation layer and including a window that exposes a top surface of the conductive plug;
forming a solder bump inside the window and coupled with the conductive plug; and
after the solder bump is formed, stripping the plating resist mask from the top surface of the dielectric passivation layer.

* * * * *